United States Patent  
Morimoto

(10) Patent No.: US 7,224,459 B2  
(45) Date of Patent: May 29, 2007

(54) EXPOSURE APPARATUS, METHOD OF CONTROLLING SAME, METHOD OF MANUFACTURING DEVICES, COMPUTER-READABLE MEMORY AND PROGRAM

(75) Inventor: Osamu Morimoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 519 days.

(21) Appl. No.: 10/234,378

(22) Filed: Sep. 5, 2002

(65) Prior Publication Data  
US 2003/0059691 A1 Mar. 27, 2003

(30) Foreign Application Priority Data  
Sep. 25, 2001 (JP) ............................. 2001-291854

(51) Int. Cl.  
G01B 11/00 (2006.01)

(52) U.S. Cl. ...................................... 356/401; 356/400

(58) Field of Classification Search ........ 356/399–401; 355/53, 55; 430/5, 22, 30; 250/548  
See application file for complete search history.

(56) References Cited

U.S. PATENT DOCUMENTS

| 4,780,617 | A | * | 10/1988 | Umatate et al. | ............. | 250/548 |
| 5,561,606 | A | * | 10/1996 | Ota et al. | ..................... | 716/19 |
| 5,585,925 | A | * | 12/1996 | Sato et al. | .................. | 356/401 |
| 5,805,866 | A | * | 9/1998 | Magome et al. | ............... | 716/19 |
| 6,278,957 | B1 | * | 8/2001 | Yasuda et al. | ............... | 702/150 |
| 6,333,786 | B1 | * | 12/2001 | Uzawa et al. | ................ | 356/401 |
| 6,481,003 | B1 | * | 11/2002 | Maeda | ........................ | 716/21 |
| 6,482,713 | B2 | * | 11/2002 | Marini | ........................ | 438/401 |
| 2004/0126004 | A1 | * | 7/2004 | Kikuchi | ...................... | 382/141 |

FOREIGN PATENT DOCUMENTS

| JP | 6-275496 | 9/1994 |
| JP | 9-266164 | 10/1997 |

* cited by examiner

Primary Examiner—Layla G. Lauchman  
Assistant Examiner—Gordon J. Stock, Jr.  
(74) Attorney, Agent, or Firm—Fitzpatrick, Cella, Harper & Scinto

(57) ABSTRACT

It is determined whether it is necessary to execute processing for automatically measuring a shot compensation parameter. Processing is reduced by performing automatic measurement of the shot compensation parameter only when such measurement is necessary. This is followed by measuring a wafer compensation parameter automatically. Depending upon whether or not automatic measurement of the shot compensation parameter has been performed, it is determined whether to calculate a relative parameter δ between the shot compensation parameter and wafer compensation parameter or to calculate a shot compensation parameter from a stored relative parameter δ and a wafer compensation parameter. This maintains alignment precision. The units comprising the apparatus are driven to perform exposure in accordance with the shot compensation parameter and wafer compensation parameter obtained.

11 Claims, 8 Drawing Sheets

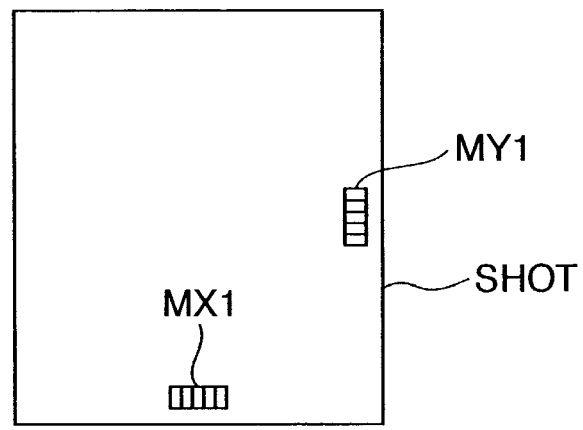
F I G. 3A
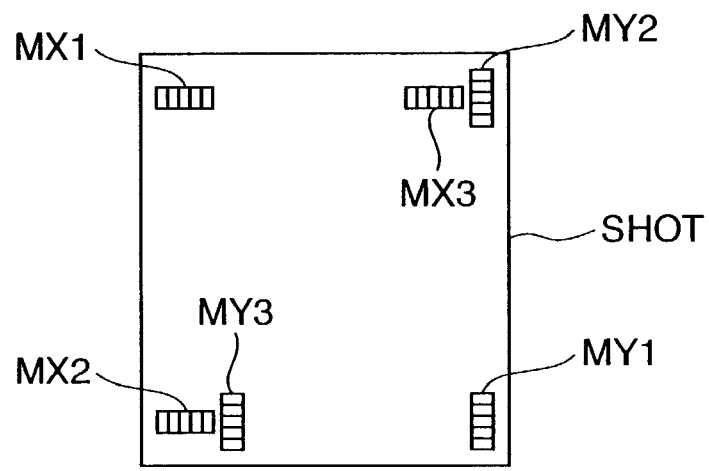
F I G. 3B
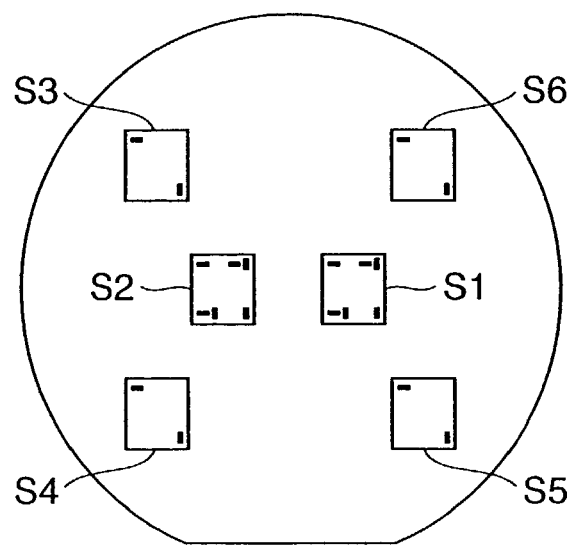
F I G. 3C

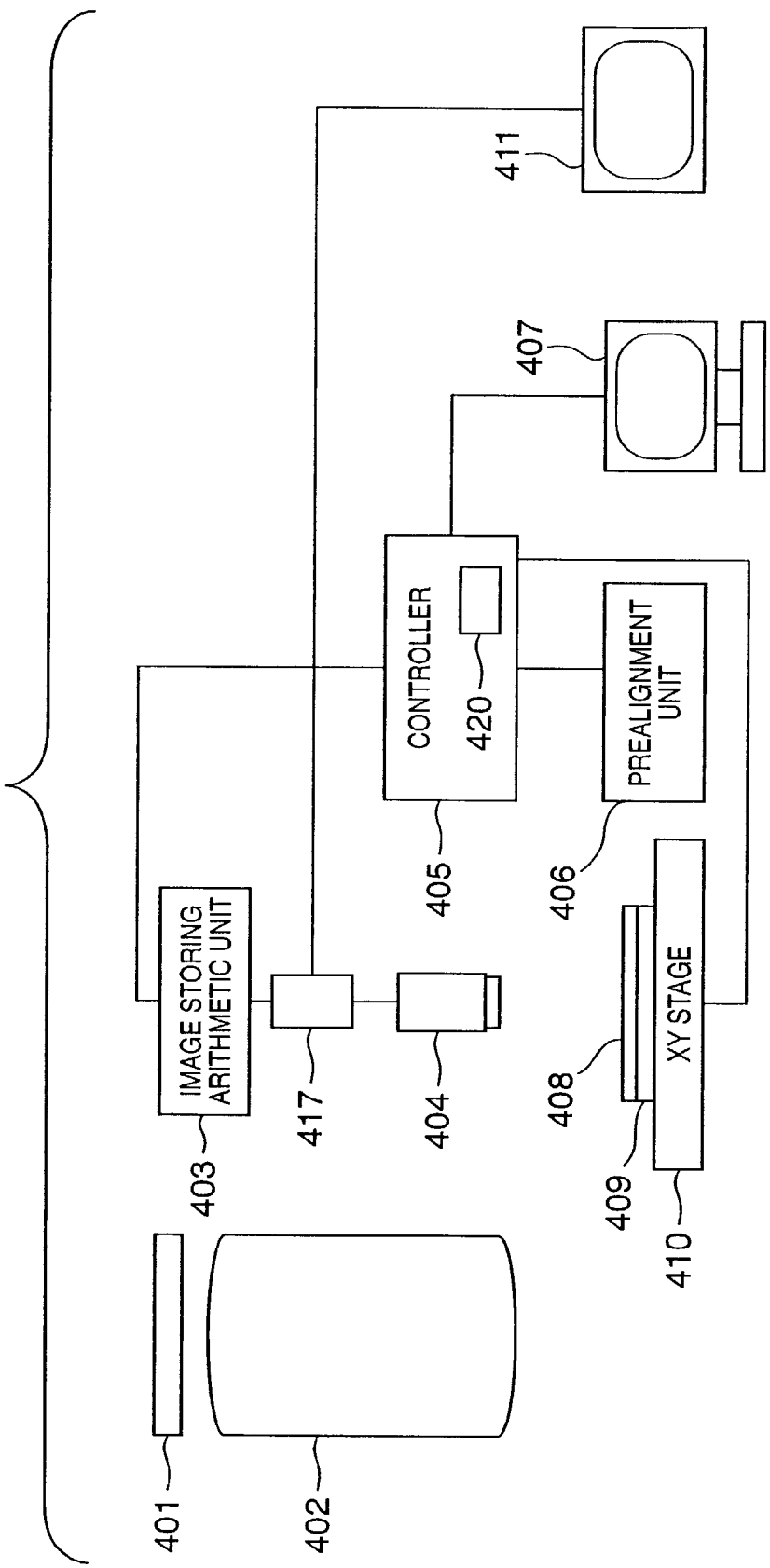

EXPOSURE APPARATUS, METHOD OF CONTROLLING SAME, METHOD OF MANUFACTURING DEVICES, COMPUTER-READABLE MEMORY AND PROGRAM

FIELD OF THE INVENTION

This invention relates to an exposure apparatus, a method of controlling the apparatus, a method of manufacturing devices by utilizing the apparatus, a computer-readable memory and a program.

BACKGROUND OF THE INVENTION

In a semiconductor exposure apparatus such as a stepper, alignment is performed in such a manner that a circuit pattern that has been formed on a reticle (mask) will be overlaid highly precisely on a circuit pattern that has been formed on a wafer (plate) serving as a substrate.

A technique referred to as AGA (Advanced Global Alignment) is known as a method of obtaining an array of circuit pattern areas (shots) that have been formed on a wafer. AGA is a technique that includes the steps of selecting several sample shots from all available shots, measuring amounts of deviation of the positions of these sample shots from a design position and subjecting the results of the measurement to statistical processing to thereby obtain wafer compensation parameters for compensating for the shot array on the wafer. The wafer compensation parameters mentioned here are the following quantities, by way of example:

(1) shift error of wafer center position (amount of translation) (Swx, Swy);

(2) wafer (shot array) rotation error (amount of rotation) ($\theta$wx, $\theta$wy); and (3) wafer (shot array) magnification error (amount of linear expansion and contraction) ($\beta$wx, $\beta$wy).

Further, the difference ($\theta$wx−$\theta$wy) between the X and Y components of the amount of wafer rotation is referred to as "wafer orthogonality".

In order to improve the precision of alignment, there has recently been proposed a method of applying a correction by obtaining the amount of deformation of a shot per se in addition to finding wafer compensation parameters. It is considered that the causes of shot deformation are device-related, such as distortion of the exposure lens, and process-related, such as deformation of the wafer due to heating. The following quantities can be mentioned as parameters (referred to as "shot compensation parameters") for correcting for shot deformation (i.e., shot shape error):

(1) shot rotation error (amount of rotation) ($\theta$sx, $\theta$sy); and (2) shot magnification error (amount of linear expansion and contraction) ($\beta$sx, $\beta$sy).

The relationship between wafer compensation parameters and shot compensation parameters is illustrated in FIGS. 1 and 2, in which FIG. 1 is a diagram illustrating the relationship between wafer magnification and shot magnification. In FIG. 1, WafD indicated by the dashed line represents the designed external shape of the wafer, and WafR indicated by the solid line represents, in exaggerated form, the external shape of the wafer in a case where the wafer has undergone expansion and contraction caused by thermal deformation, or the like. Let radial expansion of the wafer in the X and Y directions be represented by $\beta$wx and $\beta$wy, respectively, in a standard coordinate system (x,y), the origin of which is a reference point on the wafer stage of the stepper. Wafer magnification has an effect upon the shot array. In FIG. 1, the manner in which the center position of each shot deviates in the outward direction from the designed coordinates is indicated by the arrows assigned to the shots. Further, SframeD represents the designed external shape of a shot, and SframeR represents the external shape of the shot brought about when shot magnification error occurs. Shot expansion is represented by $\beta$sx, $\beta$sy in the standard coordinate system (x,y).

FIG. 2 is a diagram illustrating the relationship between wafer rotation and shot rotation. Here WafR represents, in exaggerated form, the external shape of the wafer in a case where the wafer has been rotated relative to the standard coordinate system (x,y) of the stage. Let the amount of rotation of the wafer in the X and Y directions be represented by $\theta$wx, $\theta$wy, respectively, in a standard coordinate system the center of which is a reference point on the wafer stage of the stepper. FIG. 2 illustrates a case where $\theta$wx=$\theta$wy holds, indicating the orthogonality (angular deviation) of the wafer and stage is zero. Wafer rotation has an influence upon the shot array. Further, SframeD represents the designed external shape of the shot, and SframeR represents the shape of the shot that has developed an error in orthogonality owing to shot deformation. In FIG. 2, rotation of the axes of the shot in the standard coordinate system (x, y) is represented by $\theta$sx, $\theta$sy.

With the AGA method, the amount of deviation of the shot reference position (usually the shot center) from the designed value is found by measuring the positions of alignment marks assigned within the shot. In this case, marks to be measured within the shot constitute one set, namely one shot in each of the X and Y directions. FIG. 3A illustrates an instance where marks MX1, MY1 have been disposed in a shot (SHOT).

On the other hand, in a case where a shot compensation parameter for correcting for shot deformation is found, measurement is performed upon disposing a greater number of marks (MX1 to MX3, MY1 to MY3), i.e., greater than the single set of one mark for each of the X and Y directions. A method of finding shot compensation parameters is disclosed in Japanese Patent Application Laid-Open No. 09-266164.

The general shot compensation alignment method will be described with reference to FIG. 4, which is a block diagram illustrating an off-axis wafer alignment system in a semiconductor exposure apparatus. This alignment system includes a reticle 401; a projection exposure optical system 402; an image storing arithmetic unit 403 for subjecting a provided image signal to various image processing and storing the image signal and results of processing; a pre-alignment unit 406 for adjusting coarse wafer orientation based upon a wafer external-shape reference when the wafer has been sent to the alignment system from a wafer transport apparatus (not shown); a computer terminal 407 for accepting a command input from a user; a wafer 408 that is to be aligned, a microscope 404 for enlarging and observing the image of a pattern formed on a wafer 408; a CCD camera 417 for converting the pattern image of the wafer 408, which has been obtained by the microscope 404, to an electric signal and supplying the signal to the image storing arithmetic unit 403; an XY stage 410 for moving the coordinate position of the wafer 408 in the direction of a plane and in a direction perpendicular to the plane; a wafer chuck 409 for holding the wafer 408 on the XY stage 410; a monitor 411 serving as a display mechanism by which the user checks the image provided by the microscope 404; and a controller 405 for controlling each of the above-mentioned elements. The controller 405 has a memory 420 and a CPU. The microscope 404 and CCD camera 417 are referred to as an off-axis observation optical system. In FIG. 4, it is assumed that the positions of the reticle 401 and projection exposure optical system 402 have been decided accurately by a method such as the FRA method and that the relative positional relationship (base line) among the projection exposure optical system 402 and off-axis observation optical system 404, 417 has already been measured.

As shown in FIG. 3C, measurement sample shots S1, S2 for calculating shot compensation parameters and measurement sample shots S3 to S6 for calculating wafer compensation parameters have been formed on the wafer 408. Alignment marks shown in FIG. 3B have been formed in each of measurement sample shots S1 to S6. In the measurement sample shots S1, S2, marks MX1 to MX3, MY1 to MY3 are the object of measurement for alignment. In the measurement sample shots S3 to S6, marks MX1, MY1 are the object of measurement for alignment.

FIG. 5 is a flowchart illustrating processing of the conventional technique for shot compensation alignment. The conventional technique will be described with reference to the flowchart of FIG. 5.

At step S501 in FIG. 5, wafer 408 is carried into the exposure apparatus by a wafer transport apparatus (not shown), the wafer 408 is positioned coarsely by prealignment unit 406, and then the wafer 408 is transported to the XY stage 410. The wafer 408 is held on the XY stage 410 by vacuum suction applied by the wafer chuck 409.

Steps S502 to S505 constitute a procedure for automatically measuring shot compensation parameters.

More specifically, step S502 calls for drive of the XY stage 410 to be controlled in such a manner that the alignment mark MX1, which has been formed in the first measurement shot S1, will enter the field of view of the microscope 404.

Next, at step S503, deviation of the mark position is detected. This deviation is detected as follows: First, the microscope 404 and CCD camera 417 capture the pattern of the alignment mark MX1, which is illuminated by an alignment illumination device (not shown), as an image signal. By using pattern matching, the controller 405 compares the pattern of the alignment mark stored in the image storing arithmetic unit 403 with the image that has been captured by the CCD camera 417 and calculates deviation l×1 from the designed position of the alignment mark MX1.

This is followed by step S504, at which it is determined whether steps S502, S503 have been executed for all sample shots (S1, S2). If an unprocessed shot remains, control returns to step S502. If unprocessed shots do not remain, control proceeds to step S505. Specifically, the remaining alignment marks MX2, MX3, MY1 to MY3 in the first measurement shot S1 are measured through a procedure similar to that for MX1, and positional deviations lxn, lyn (n=1 to 3, where n is assigned based upon the mark number) of each mark in the x and y directions are measured.

If the positional deviation of each mark has been measured ("YES" at step S504) for all sample shots, then the shot compensation parameters are calculated at step S505. A method of calculating shot compensation parameters is as follows:

Shot compensation parameters are found for each shot of the sample shots S1 to S4. The designed position of each mark that resides in the shot is represented by (dxn,dyn) (n=1 to 3), where the center of the shot is taken as the origin. The mark position (dxn',dyn') compensated for by the shot compensation parameters is expressed as follows by Equation (1):

$$\begin{pmatrix} dxn' \\ dyn' \end{pmatrix} = \begin{bmatrix} 1+\beta sx & -\theta sy \\ \theta sx & 1+\beta sy \end{bmatrix} \begin{pmatrix} dxn \\ dyn \end{pmatrix} + \begin{pmatrix} Ssx \\ Ssy \end{pmatrix} \quad (1)$$

where Ssx, Ssy represent amounts of shift error of the shot center. Further, the actual position of the measured mark is expressed as follows by Equation (2):

$$\begin{pmatrix} dxn \\ dyn \end{pmatrix} + \begin{pmatrix} lxn \\ lyn \end{pmatrix} \quad (2)$$

A compensation residual V is expressed as follows by Equation (3):

$$V = \frac{1}{m}\sum_{n=1}^{m}\left|\begin{pmatrix} dxn \\ dyn \end{pmatrix} + \begin{pmatrix} lxn \\ lyn \end{pmatrix} - \begin{pmatrix} dxn' \\ dyn' \end{pmatrix}\right|^2 \quad (3)$$

$$= \frac{1}{m}\sum_{n=1}^{m}\left|\begin{pmatrix} lxn \\ lyn \end{pmatrix} - \begin{bmatrix} \beta sx & -\theta sy \\ \theta sx & \beta sy \end{bmatrix}\begin{pmatrix} dxn \\ dyn \end{pmatrix} + \begin{pmatrix} Ssx \\ Ssy \end{pmatrix}\right|^2$$

Since lxn, lyn, dxn, dyn are already known, it will suffice to obtain {Ssx, Ssy, θsx, θsy, βsx, βsy} by solving simultaneous equations that minimize V. Here it will suffice to use a shot array in which shifts Ssx, Ssy of the shot array have been found as the result of calculating wafer compensation parameters of fth-degree step, and therefore it is not necessary to use the value found here in subsequent compensating drive. As the result of measuring a plurality of sample shots, the number of shot compensation parameters obtained is equivalent to the number of sample shots. By subsequently taking the average of these parameters, therefore, shot compensation parameters of the wafer are obtained.

Steps S506 to S509 constitute a procedure for calculating wafer compensation parameters. This method is the aforementioned AGA technique.

Step S506 calls for the controller 405 to drive the XY stage 410 in such a manner that the alignment mark MX1, which has been formed in the first sample shot S3 for wafer measurement, will enter the field of view of the microscope 404.

Next, at step S507, the mark position is detected. The method of detecting mark position is similar to that of step S503 above. Deviation lxk (k=3 to 6, where k is assigned based upon the sample-shot number) from the designed position of the alignment mark MX1 is calculated at step S507.

This is followed by step S508, at which it is determined whether steps S506, S507 have been executed for all sample shots (S3 to S6). If an unprocessed shot remains, control returns to step S506. If unprocessed shots do not remain, control proceeds to step S509. Specifically, the remaining alignment mark MY1 in the first measurement shot S3 is measured through a procedure similar to that for MX1, and a positional deviation lyk of the mark in the Y direction is calculated. Further, the processing of steps S506, S507 is repeated with regard to all sample shots (S3 to S6), and lxk, lyk (k=3 to 6) are found for every sample shot.

If the positional deviations of each of the marks are found for all sample shots ("YES" at step S508), then the wafer compensation parameters are calculated at step S509. A method of calculating wafer compensation parameters is as follows:

First, deviations (lxk,lyk) of the reference position (usually the position of the shot center) of each sample shot from the designed value are found. Coordinates obtained by adding the measured deviations (lxk,lyk) of the alignment marks to the designed positions of the marks from the center position of the sample shot are the coordinates of the actual mark position.

Deviations (Lxk,Lyk) from the center position of the shot are found by taking the average of these values. The designed position of the center of each sample shot that resides in the wafer is represented by (Dxk,Dyk). A shot-center position (Dxk',Dyk') compensated for by the wafer compensation parameters is expressed as follows by Equation (4):

$$\begin{pmatrix} Dxk' \\ Dyk' \end{pmatrix} = \begin{bmatrix} 1+\beta wx & -\theta wy \\ \theta wk & 1+\beta wy \end{bmatrix} \begin{pmatrix} Dxk \\ Dyk \end{pmatrix} + \begin{pmatrix} Swk \\ Swk \end{pmatrix} \quad (4)$$

Further, the actual position of the shot center obtained as the result of measurement is expressed as follows by Equation (5):

$$\begin{pmatrix} Dxk \\ Dyk \end{pmatrix} + \begin{pmatrix} Lxk \\ Lyk \end{pmatrix} \quad (5)$$

A compensation residual V is expressed as follows by Equation (6):

$$V = \frac{1}{m} \sum_{k=1}^{m} \left| \begin{pmatrix} Dxk \\ Dyk \end{pmatrix} + \begin{pmatrix} Lxk \\ Lyk \end{pmatrix} - \begin{pmatrix} Dxk' \\ Dyk' \end{pmatrix} \right|^2 \quad (6)$$

$$= \frac{1}{m} \sum_{k=1}^{m} \left| \begin{pmatrix} Lxk \\ Lyk \end{pmatrix} - \begin{bmatrix} \beta wx & -\theta wy \\ \theta wx & \beta wy \end{bmatrix} \begin{pmatrix} Dxk \\ Dyk \end{pmatrix} + \begin{pmatrix} Swx \\ Swy \end{pmatrix} \right|^2$$

Since Lxk, Lyk, Dxk, Dyk are already known, it will suffice to obtain {Swx, Swy, θwx, θwy, βwx, βwy} by solving simultaneous equations that minimize V.

If shot compensation parameters and wafer compensation parameters have been found, each unit of the exposure apparatus is driven (subjected to compensating drive) at step S510 in accordance with these compensation parameters so as to diminish the error between the shot array and shot shape.

Finally, control proceeds to step S511 to carry out exposure.

By repeating steps S501 to S511 for all wafers to be exposed, it is possible to perform the exposure of each shot with a high overlay precision in accordance with the compensated shot array and shot shape.

The minimum required number of marks to calculate the wafer compensation parameters in a shot is one set for X and Y (one X measurement mark and one Y measurement mark, or one X-Y measurement mark).

However, the number of alignment marks that must be measured within a shot in order to find shot compensation parameters is greater than one set for X and Y. In accordance with Equation (3), at least three sets of alignment marks for X, Y must be measured in order to independently calculate all of the shot compensation parameters {θsx, θsy, βsx, βsy, Ssx, Ssy}.

With the conventional alignment method of measuring and compensating for shot compensation parameters automatically, it is necessary to perform measurements at sample shots and alignment marks for calculation of shot compensation parameters on a wafer-by-wafer basis. As a result, measurement is performed at many sample shots and alignment marks for each and every wafer. A problem which results is a decline in throughput.

SUMMARY OF THE INVENTION

Accordingly, an object of the present invention is to raise throughput in an exposure apparatus and a method of controlling the same, without sacrificing alignment accuracy when a reticle pattern is aligned with respect to each of a plurality of shot areas on a substrate.

According to a first aspect of the present invention, the foregoing object is attained by providing an exposure apparatus for executing exposure processing upon aligning a reticle pattern with respect to each of a plurality of shot areas on a substrate based upon compensation parameters, the apparatus comprising: a first decision unit for measuring the positions of marks on each substrate with regard to substrates constituting a first group of substrates among a plurality of substrates to be exposed, and deciding a shot compensation parameter for compensating for a shape error of a plurality of shot areas on each of the first group of substrates, based upon results of the measurement; a second decision unit for deciding a substrate compensation parameter for compensating for an array error of a plurality of shot areas on each substrate with regard to all of the plurality of substrates to be exposed; and a third decision unit for deciding a shot compensation parameter for a second group of substrates, other than the first group of substrates, among the plurality of substrates to be exposed, based upon the shot compensation parameter decided by the first decision unit and the substrate compensation parameter decided by the second decision unit.

In accordance with a preferred embodiment of the present invention, the third decision unit includes a first calculation unit for calculating a relative parameter that indicates a relative relationship between the shot compensation parameter regarding the first group of substrates decided by the first decision unit and the substrate compensation parameter regarding the first group of substrates decided by the second decision unit; and a second calculation unit for calculating a shot compensation parameter regarding the second group of substrates based upon the relative parameter calculated by the first calculation unit and the substrate compensation parameter regarding the second group of substrates decided by the second decision unit.

In accordance with a preferred embodiment of the present invention, the relative parameter is decided based upon the difference between the substrate compensation parameter and the shot compensation parameter.

In accordance with a preferred embodiment of the present invention, the relative parameter is decided based upon the ratio between the substrate compensation parameter and the shot compensation parameter.

In accordance with a preferred embodiment of the present invention, whether a substrate to be exposed belongs to the first group of substrates or the second group of substrates is selected depending upon the number of substrates processed.

In accordance with a preferred embodiment of the present invention, whether a substrate to be exposed belongs to the first group of substrates or the second group of substrates is selected by a command from an external unit.

According to a second aspect of the present invention, the foregoing object is attained by providing a method of controlling an exposure apparatus for executing exposure processing upon aligning a reticle pattern with respect to each of a plurality of shot areas on a substrate based upon compensation parameters, comprising: a first decision step of measuring positions of marks on each substrate with regard to substrates constituting a first group of substrates among a plurality of substrates to be exposed, and deciding a shot compensation parameter for compensating for shape error of a plurality of shot areas on each of the first group of substrates based upon results of the measurement; a second decision step of deciding a substrate compensation parameter for compensating for array error of a plurality of shot areas on each substrate with regard to all of the plurality of substrates to be exposed; and a third decision step of deciding a shot compensation parameter for a second group of substrates, other than the first group of substrates, among the plurality of substrates to be exposed, based upon the shot compensation parameter decided at the first decision step and the substrate compensation parameter decided at the second decision step.

In accordance with a preferred embodiment of the present invention, the third decision step includes a first calculation step of calculating a relative parameter that indicates a relative relationship between the shot compensation parameter regarding the first group of substrates decided at the first decision step and the substrate compensation parameter regarding the first group of substrates decided at the second decision step; and a second calculation step of calculating a shot compensation parameter regarding the second group of substrates based upon the relative parameter calculated at the first calculation step and the substrate compensation parameter regarding the second group of substrates decided by the second decision step.

In accordance with a preferred embodiment of the present invention, the relative parameter is decided based upon the difference between the substrate compensation parameter and the shot compensation parameter.

In accordance with a preferred embodiment of the present invention, the relative parameter is decided based upon the ratio between the substrate compensation parameter and the shot compensation parameter.

In accordance with a preferred embodiment of the present invention, whether a substrate to be exposed belongs to the first group of substrates or the second group of substrates is selected depending upon the number of substrates processed.

In accordance with a preferred embodiment of the present invention, whether a substrate to be exposed belongs to the first group of substrates or the second group of substrates is selected by a command from an external unit.

According to a third aspect of the present invention, the foregoing object is attained by providing a program for an exposure apparatus for executing exposure processing upon aligning a reticle pattern with respect to each of a plurality of shot areas on a substrate based upon compensation parameters, comprising: a first decision step of measuring positions of marks on each substrate with regard to substrates constituting a first group of substrates among a plurality of substrates to be exposed, and deciding a shot compensation parameter for compensating for shape error of a plurality of shot areas on each of the first group of substrates based upon results of the measurement; a second decision step of deciding a substrate compensation parameter for compensating for array error of a plurality of shot areas on each substrate with regard to all of the plurality of substrates to be exposed; and a third decision step of deciding a shot compensation parameter for a second group of substrates, other than the first group of substrates, among the plurality of substrates to be exposed, based upon the shot compensation parameter decided at the first decision step and the substrate compensation parameter decided at the second decision step.

According to a fourth aspect of the present invention, the foregoing object is attained by providing a computer-readable memory storing a program for an exposure apparatus for executing exposure processing upon aligning a reticle pattern with respect to each of a plurality of shot areas on a substrate based upon compensation parameters, the program comprising: a first decision step of measuring the position of a mark on each substrate with regard to substrates constituting a first group of substrates among a plurality of substrates to be exposed, and deciding a shot compensation parameter for compensating for shape error of a plurality of shot areas on each of the first group of substrates based upon results of the measurement; a second decision step of deciding a substrate compensation parameter for compensating for array error of a plurality of shot areas on each substrate with regard to all of the plurality of substrates to be exposed; and a third decision step of deciding a shot compensation parameter for a second group of substrates, other than the first group of substrates, among the plurality of substrates to be exposed, based upon the shot compensation parameter decided at the first decision step and the substrate compensation parameter decided at the second decision step.

According to a fifth aspect of the present invention, the foregoing object is attained by providing a device manufacturing method comprising: a coating step of coating a substrate with a photosensitive material; an exposure step of printing a pattern on the substrate, which has been coated with the photosensitive material at the coating step; and a developing step of developing the photosensitive material on the substrate on which the pattern has been printed at the exposure step, wherein the exposure step includes: a first decision step of measuring positions of marks on substrates constituting a first group of substrates among a plurality of substrates to be exposed, and deciding a shot compensation parameter for compensating for shape error of a plurality of shot areas on the first group of substrates based upon results of the measurement; a second decision step of deciding a substrate compensation parameter for compensating for array error of a plurality of shot areas on substrates with regard to all of the plurality of substrates to be exposed; and a third decision step of deciding a shot compensation parameter with regard to a second group of substrates, other than the first group of substrates, among the plurality of substrates to be exposed, based upon the shot compensation parameter decided by the first decision unit and the substrate compensation parameter decided by the second decision unit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A to 3C are diagrams describing the placement of alignment marks and sample shots;

FIG. 4 is a diagram illustrating the general configuration of a semiconductor exposure apparatus according to a preferred embodiment of the present invention;

DESCRIPTION OF THE PREFERRED EMBODIMENT

A preferred embodiment of the present invention will now be described with reference to the accompanying drawings.

The exposure apparatus according to the embodiment can be implemented through a system configuration similar to that of the prior art example shown in FIG. 4. Further, with regard to a wafer that is to be aligned in the embodiment, it is assumed that marks of the kind shown in FIG. 3B have been placed in each shot on the wafer in a manner similar to that of the prior art example, and it is assumed that sample shots of the kind shown in FIG. 3C are placed as shots for wafer compensation and for shot compensation.

The flow of processing by the exposure apparatus according to a preferred embodiment of the invention will be described with reference to FIG. 6. It should be noted that this processing is controlled by the controller 405.

Figure 6:
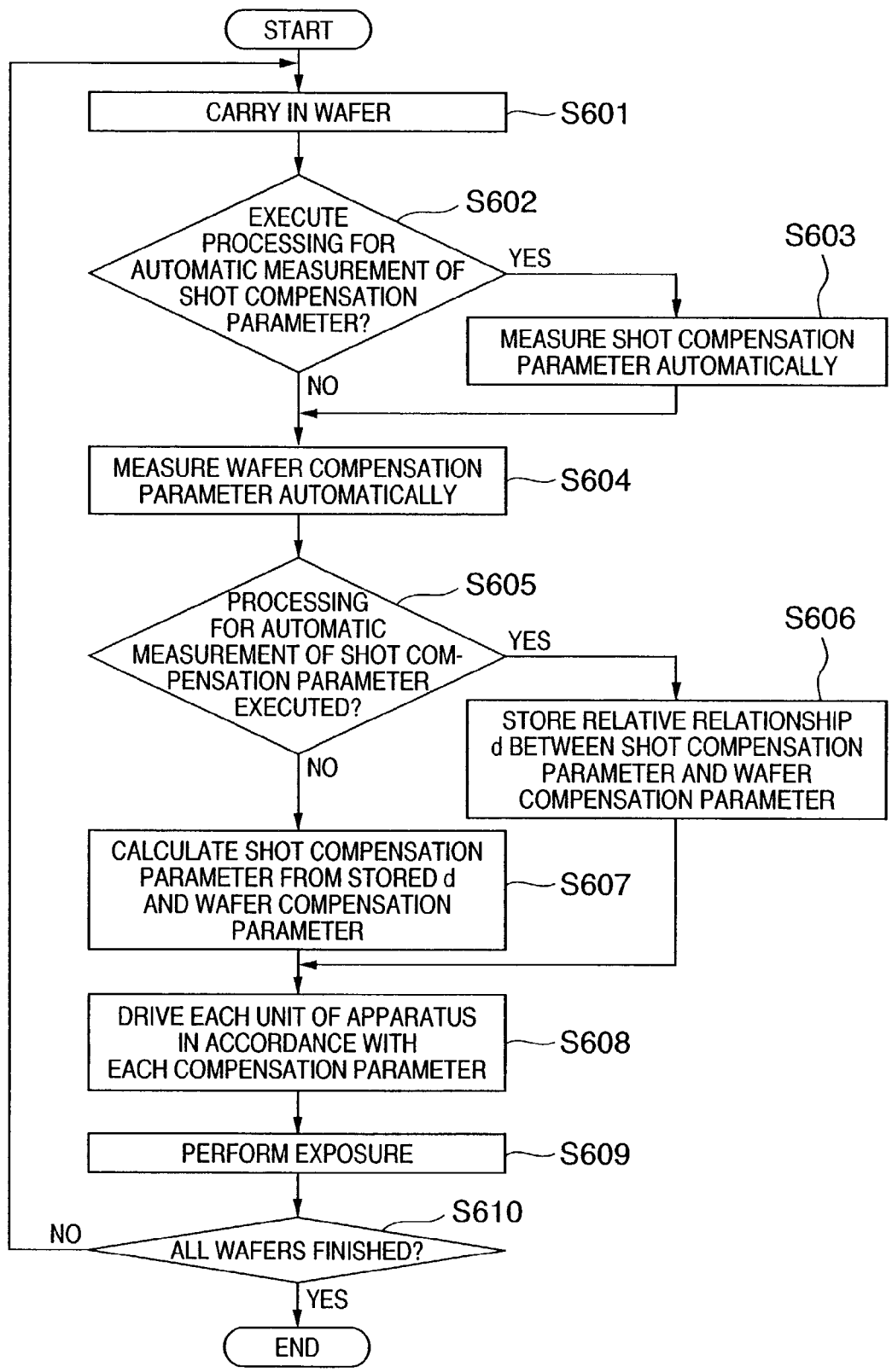
FIG. 6 is a flowchart illustrating exposure processing according to a preferred embodiment of the present invention.

Step S601 in FIG. 6 calls for a wafer to be carried to the XY stage by a wafer transport apparatus (not shown).

It is determined at step S602 whether it is necessary to execute processing for automatically measuring shot compensation parameters with regard to a wafer currently being treated. Conceivable criteria for making this determination are as follows:

(1) Processing for automatically measuring shot compensation parameters is executed if the wafer is the leading wafer in the lot to be processed.

(2) Processing for automatically measuring shot compensation parameters is executed if the wafer is one that is up to an Nth wafer from the first wafer in the lot be processed.

(3) Processing for automatically measuring shot compensation parameters is executed for every certain number of wafers.

(4) Processing for automatically measuring shot compensation parameters is executed when a command arrives from an external host computer connected online.

If it is so arranged that the user can employ the computer terminal 407 to select which of these criteria to use, processes of greater flexibility can be supported.

If it is determined that it is not necessary to execute processing for automatically measuring shot compensation parameters, control proceeds to step S604. On the other hand, if it is determined that it is necessary to execute processing for automatically measuring shot compensation parameters, control proceeds to step S603.

Figure 1:
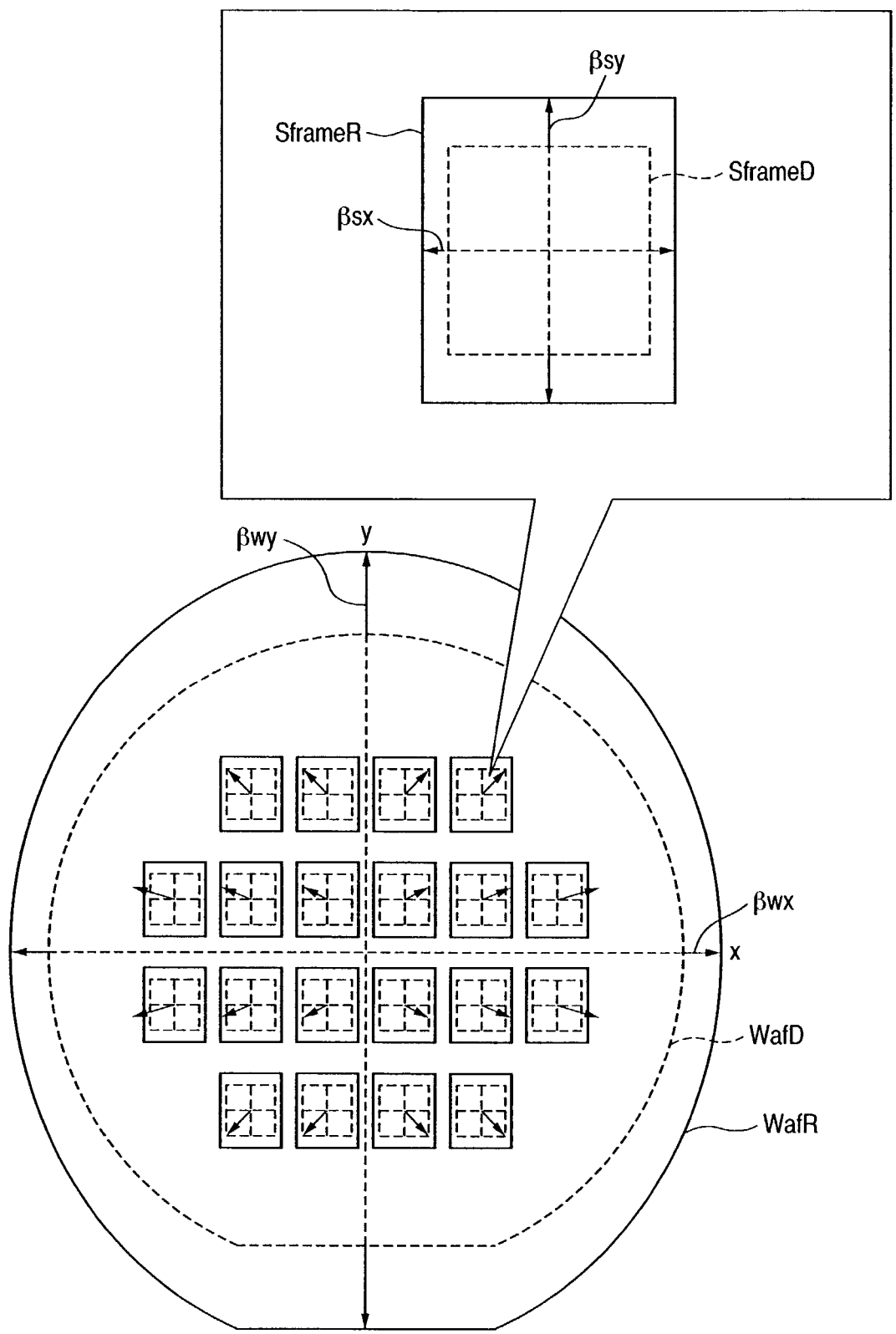
FIG. 1 is a diagram illustrating the relationship between wafer magnification and shot magnification.
Figure 2:
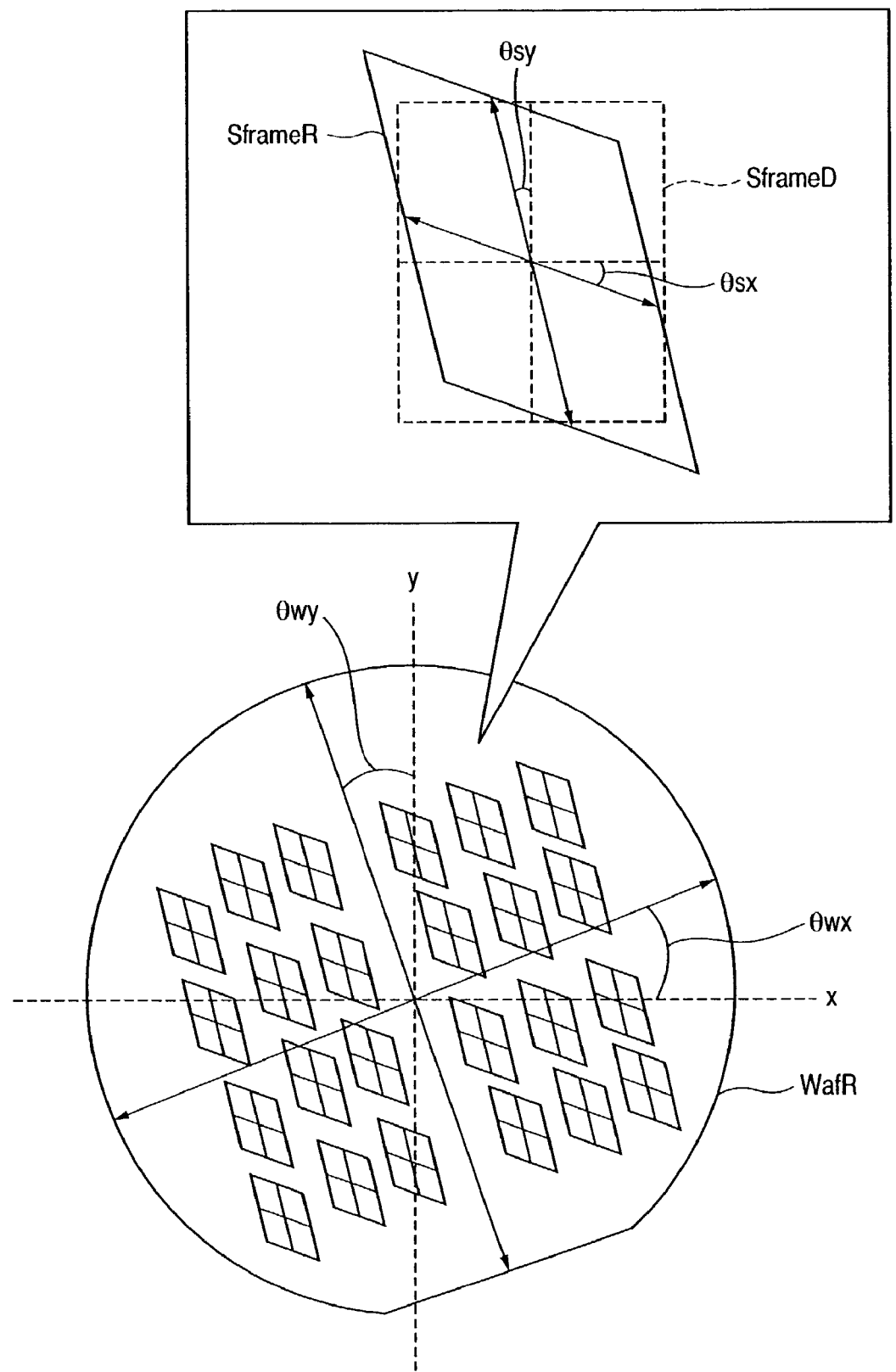
FIG. 2 is a diagram illustrating the relationship between wafer rotation and shot rotation.
Figure 5:
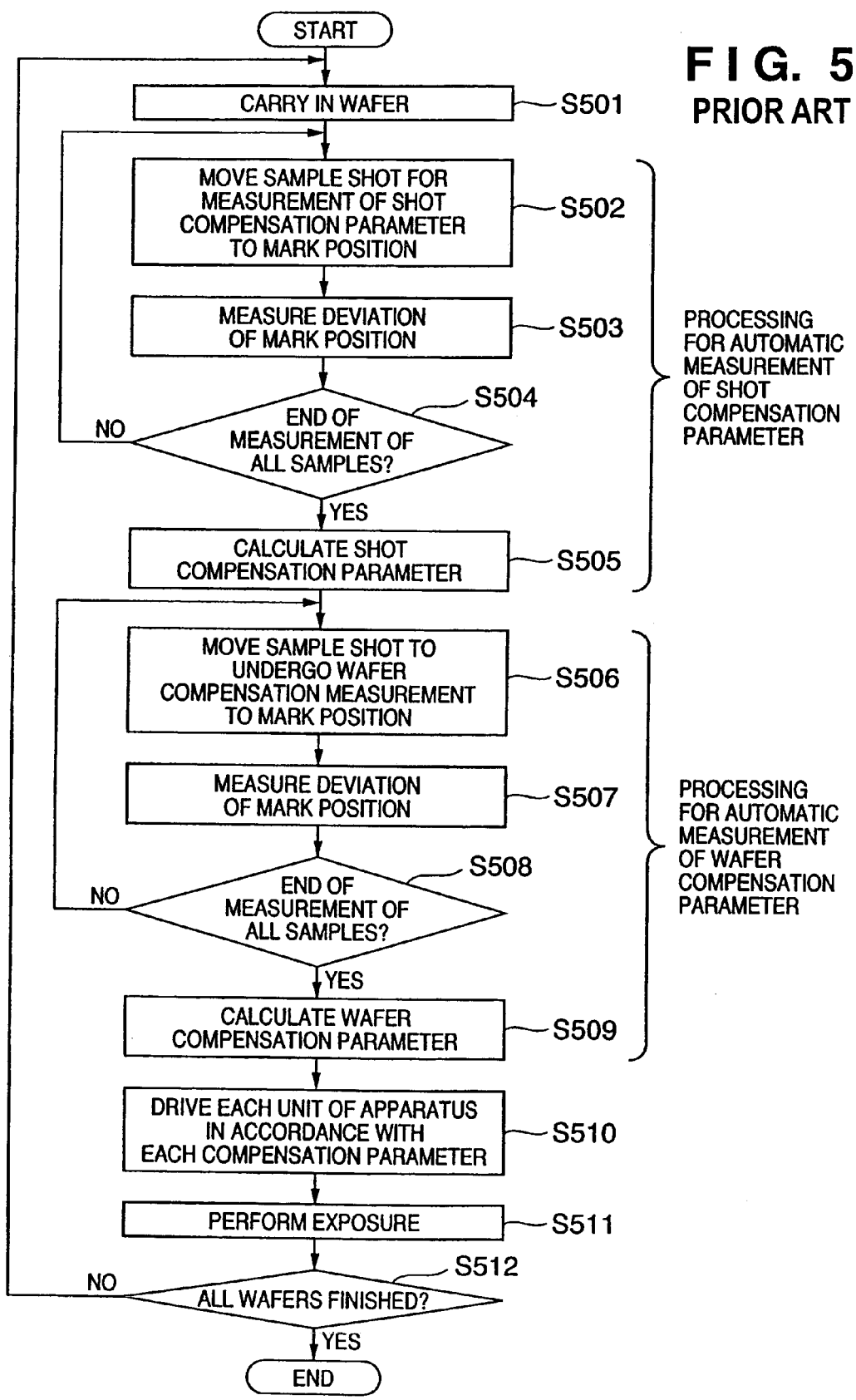
FIG. 5 is a flowchart illustrating exposure processing according to the prior art.

Processing for automatically measuring shot compensation parameters is executed at step S603. This method is similar to that of the procedure of steps S502 to S504 in FIG. 5.

Wafer compensation parameters are measured automatically at step S604. This method is similar to that of the procedure of steps S506 to S509 in FIG. 5. It is determined at step S605 whether processing for automatically measuring shot compensation parameters has been executed. If shot compensation has been carried out, control proceeds to step S606; otherwise, control proceeds to step S607. At step S607, a shot compensation parameter is calculated from the stored (1) relative relationship d between the shot compensation parameter and the wafer compensation parameter, and (2) the wafer compensation parameter. Then, control proceeds to step S608.

At step S606, a relative parameter δ, which quantitatively represents the relative relationship between the shot compensation parameter found at step S603 and the wafer compensation parameter found at step S604, is calculated, and this parameter is stored. A method of obtaining the relative parameter δ will be described below. It should be noted that a symbol obtained by appending a subscript to δ is one example of the relative parameter.

Shot magnifications βsx, βsy are obtained by superimposing magnification components, which are produced owing to wafer deformation caused by the machining process, and magnification components ascribable to the projection magnification of the apparatus. The former components vary in value from one wafer to the next, but the latter components do not vary in value, even if the wafer is changed, because they are decided by apparatus-related factors. If it is assumed that a magnification component decided by wafer-related factors is equal to wafer magnification, then shot magnification components ($\delta_{\beta X}$, $\delta_{\beta Y}$) decided by apparatus-related factors will be expressed as follows by Equation (7):

$$\begin{pmatrix} \delta_{\beta X} \\ \delta_{\beta Y} \end{pmatrix} = \begin{pmatrix} \beta sx - \beta wx \\ \beta sy - \beta wy \end{pmatrix} \quad (7)$$

Further, depending upon the process, there are also cases where it is better to represent the relative relationship between shot magnification and wafer magnification by a ratio, in which this will be expressed as follows by Equation (8):

$$\begin{pmatrix} \delta_{\beta X} \\ \delta_{\beta Y} \end{pmatrix} = \begin{pmatrix} \beta sx / \beta wx \\ \beta sy / \beta wy \end{pmatrix} \quad (8)$$

In addition, when the relative relationship between shot magnification and wafer magnification is represented quantitatively, ($\delta_{\beta X}$, $\delta_{\beta Y}$) may be calculated in accordance with the relation F between them. This is expressed as follows by Equation (9):

$$\begin{pmatrix} \delta_{\beta X} \\ \delta_{\beta Y} \end{pmatrix} = F(\beta sx, \beta wx, \beta sy, \beta wy) \quad (9)$$

As for shot rotation, the following case should be taken into consideration if the relative relationship between shot rotation and wafer rotation is to be found: Specifically, owing to error exhibited by the XY stage 410, the layer underlying the pattern that has been formed on the wafer may be rotated and burned. A shot rotation component ascribable to such burning is considered to be substantially equal to wafer rotation. This value differs from wafer to wafer. On the other hand, with regard to orthogonality of the shot brought about by the effect of distortion of the projection exposure optical system 402 when the shot is printed, a variation in value from wafer to wafer is deemed to be negligible.

Accordingly, the shot rotation components ($\delta_{\theta X}$, $\delta_{\theta Y}$), the values of which do not change from wafer to wafer, are expressed as follows by Equation (10):

$$\begin{pmatrix} \delta_{\theta X} \\ \delta_{\theta Y} \end{pmatrix} = \begin{pmatrix} \theta sx - \theta wx \\ \theta sy - \theta wy \end{pmatrix} \quad (10)$$

Further, in a case where orthogonality of the wafer (shot array) is small, we may assume θwx=θwy in Equation (10), which gives Equation (11):

$$\begin{pmatrix} \delta_{\theta X} \\ \delta_{\theta Y} \end{pmatrix} = \begin{pmatrix} \theta sx - \theta wy \\ \theta sy - \theta wy \end{pmatrix} \quad (11)$$

In addition, when the relative relationship between shot rotation and wafer rotation is represented quantitatively, ($\delta_{\theta X}$, $\delta_{\theta Y}$) may be calculated in accordance with the relation G between them. This is expressed as follows by Equation (12):

$$\begin{pmatrix} \delta_{\theta X} \\ \delta_{\theta Y} \end{pmatrix} = G(\theta sx, \theta wx, \theta sy, \theta wy) \quad (12)$$

Thus, at step S606, $\delta = (\delta_{\beta X}, \delta_{\beta Y}, \delta_{\theta X}, \delta_{\theta Y})$ is obtained and these values are stored in memory 420.

If automatic measurement of shot compensation parameter has not been carried out, then the shot compensation parameter of the wafer currently being processed is predicted based upon the wafer compensation parameter and above-mentioned relative parameter at step 607. For example, if shot magnification is to be found and ($\delta_{\beta X}$, $\delta_{\beta Y}$) obtained in accordance with Equation (7) have been stored in the memory 420, then shot magnification can be obtained by the following equation (13) based upon ($\delta_{\beta X}$, $\delta_{\beta Y}$) and the wafer compensation parameters ($\beta_{wx}$, $\beta_{wy}$):

$$\begin{pmatrix} \beta sx \\ \beta sy \end{pmatrix} = \begin{pmatrix} \beta wx + \delta_{\beta X} \\ \beta wy + \delta_{\beta Y} \end{pmatrix} \quad (13)$$

In general, if the relative relationship between shot magnification and wafer magnification is expressed by the function F, as indicated in Equation (9), then shot magnification can be calculated by the inverse function $F^{-1}$ in accordance with Equation (14) below based upon $\delta$ ($\delta_{\beta X}$, $\delta_{\beta Y}$) and the wafer magnification ($\beta_{wx}$, $\beta_{wy}$).

$$\begin{pmatrix} \beta sx \\ \beta sy \end{pmatrix} = F^{-1}(\delta_{\beta X}, \delta_{\beta Y}, \beta wx, \beta wy) \quad (14)$$

Similarly, with regard to shot rotation as well, if the relative relationship between shot rotation and wafer rotation is expressed by the function G, as indicated in Equation (11), then shot rotation can be calculated by the inverse function $G^{-1}$ in accordance with Equation (15) below based upon $\delta$ ($\delta_{\theta X}$, $\delta_{\theta Y}$) and the wafer rotation ($\theta_{wx}$, $\theta_{wy}$).

$$\begin{pmatrix} \theta sx \\ \theta sy \end{pmatrix} = G^{-1}(\delta_{\theta X}, \delta_{\theta Y}, \theta wx, \theta wy) \quad (15)$$

If the shot compensation parameter and wafer compensation parameter have been found, then each unit of the exposure apparatus is driven (subjected to compensating drive) at step S608 in accordance with these compensation parameters so as to reduce the error between the shot array and shot shape.

After the compensation is applied at step S608, control proceeds to step S609, at which the wafer is actually exposed.

It is determined at step S610 whether or not all wafer processing has ended. If all wafer processing has not ended, then steps S601 to S609 are repeated successively with regard to remaining wafers to be processed. If wafers to be processed no longer remain, then this series of processing is terminated and the exposure apparatus is halted.

In accordance with the embodiment of the present invention, only a limited number of wafers among a plurality of wafers to be processed need undergo automatic measurement of shot compensation parameters. As a result, processing time can be shortened greatly in comparison with the prior art. Further, the relative relationship between a shot compensation parameter and wafer compensation parameter is calculated as the relative parameter δ and this is stored in memory. As a result, even a wafer for which the shot compensation parameter has not been measured automatically can be aligned highly precisely by using the relative parameter δ.

Further, though the shot compensation parameter in the embodiment is the amount of rotation (orthogonality) or magnification, the technique of the embodiment is effective also in a case wherein alignment is carried out upon measuring another compensation parameter obtained by measuring more alignment marks than one set for X and Y. For example, trapezoidal distortion and barrel-type or pincushion-type shot distortion can be calculated quantitatively by measuring a number of alignment marks, and the calculated value can be adopted as a shot compensation parameter. At this time, the present embodiment is applied by representing the relative relationship between the shot compensation parameter and the wafer compensation parameter by a constant function. This will make it possible to achieve a higher exposure processing speed.

Figure 7:
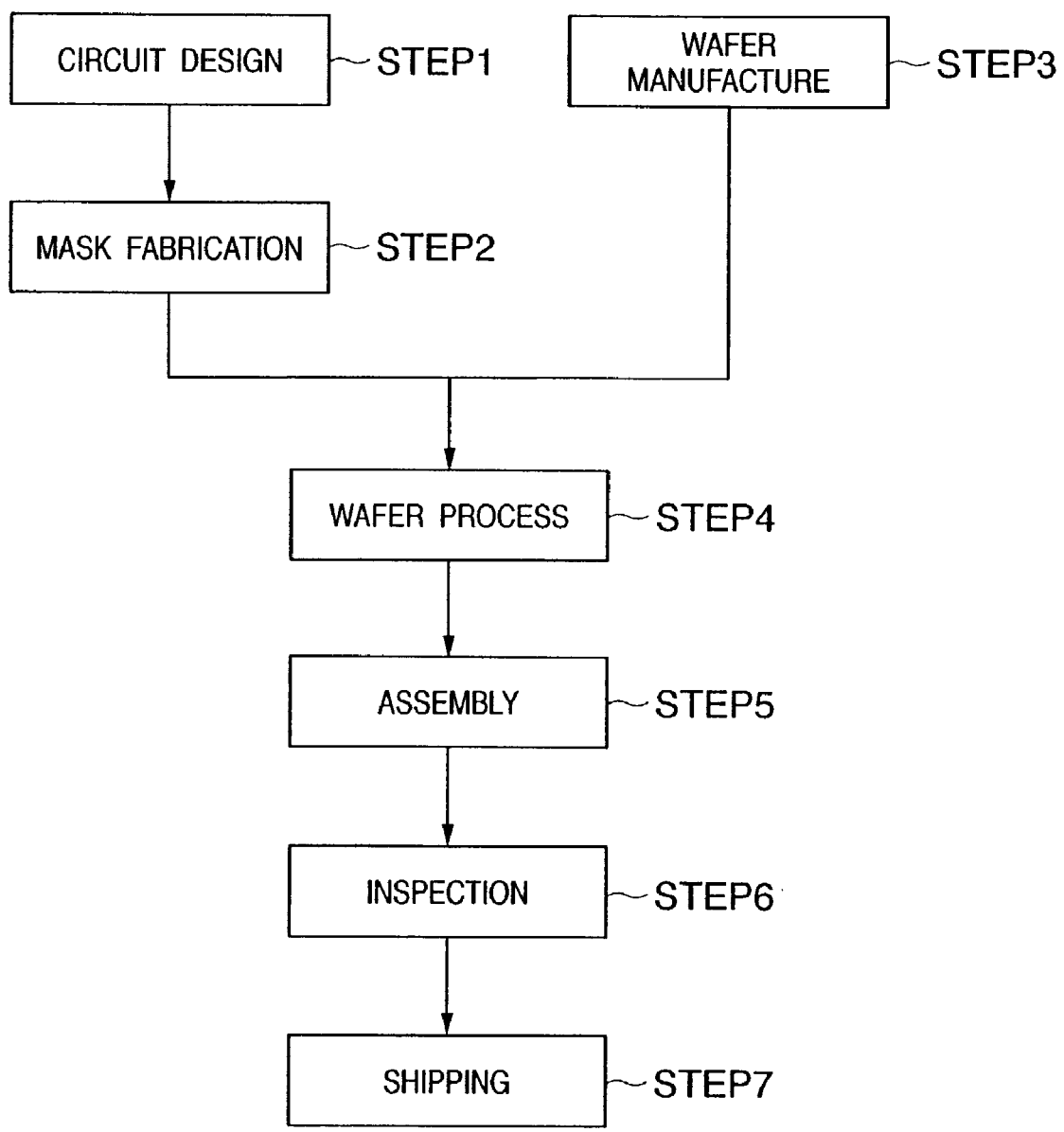
FIG. 7 is a diagram illustrating the overall flow of a process for manufacturing semiconductor devices.

A process for manufacturing a semiconductor device utilizing the exposure apparatus set forth above will now be described. FIG. 7 illustrates the overall flow of a process for manufacturing semiconductor devices. The circuit for the semiconductor device is designed at step 1 (circuit design). A mask is fabricated at step 2 (mask fabrication) based upon the circuit designed. Meanwhile, a wafer is manufactured using a material such as silicon at step 3 (wafer manufacture). The actual circuit is formed on the wafer by lithography, using the mask and wafer that have been prepared, at step 4 (wafer process), which is also referred to as "pretreatment". A semiconductor chip is obtained, using the wafer fabricated at step 4, at step 5 (assembly), which is also referred to as "post-treatment". This step includes assembly steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7).

Figure 8:
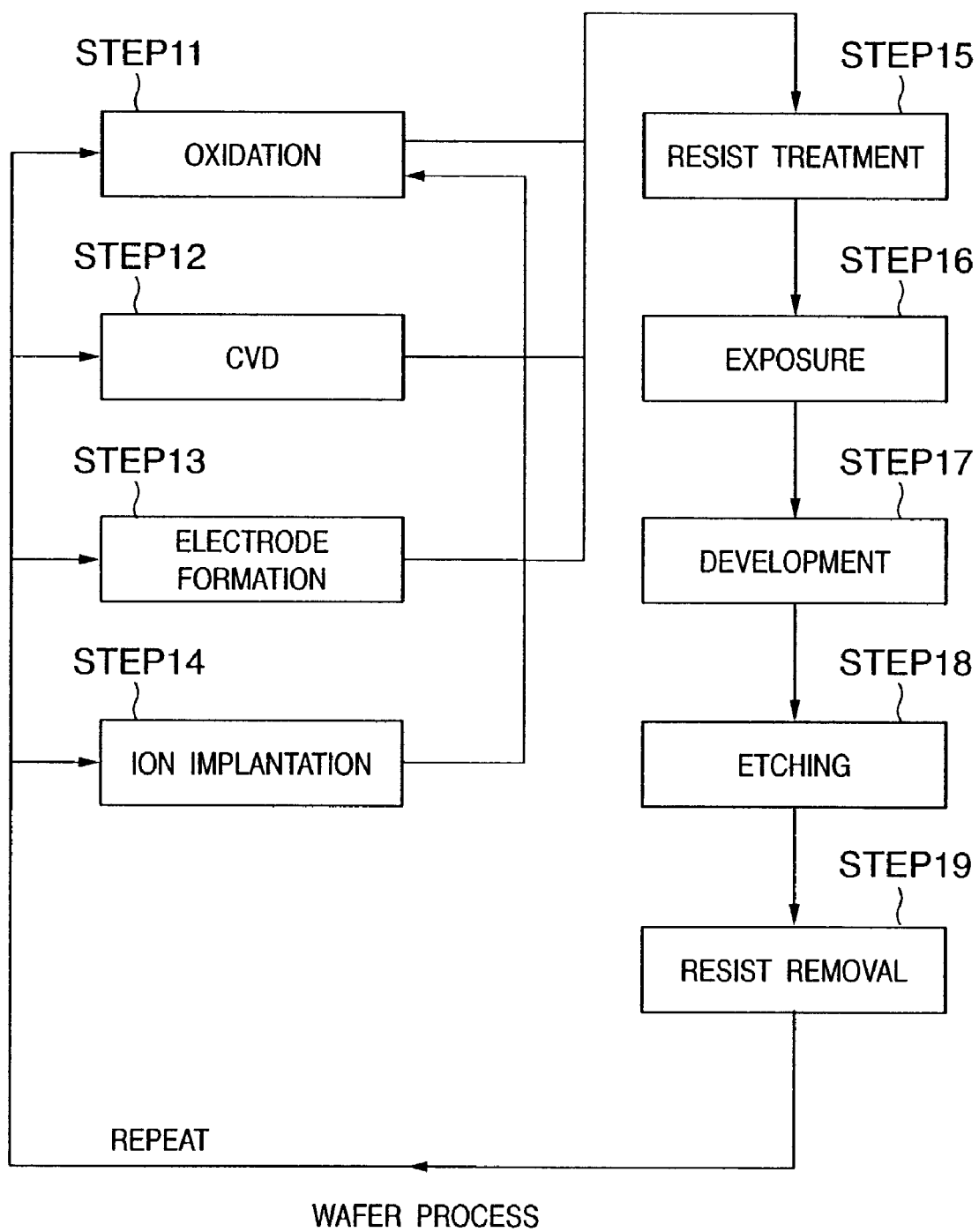
FIG. 8 is a diagram illustrating the detailed flow of the wafer process depicted in FIG. 7.

FIG. 8 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment) and the circuit pattern is transferred to the wafer by the above-described exposure apparatus at step 16 (exposure). The exposed wafer is developed at step 17 (development). Portions other than the developed photoresist image are etched away at step 18 (etching), and unnecessary resist left after etching is removed at step 19 (resist removal). Multiple circuit patterns are formed on the wafer by implementing these steps repeatedly.

Though a preferred embodiment of the present invention has been described in detail, the present invention may be applied also to a system constituted by a plurality of devices or to an apparatus comprising a single device.

Furthermore, there are cases where the object of the invention is attained also by supplying a software program (a program corresponding to the flowchart shown in FIG. 6 of the foregoing embodiment), which implements the functions of the foregoing embodiment, directly or remotely to a system or apparatus, reading the supplied program codes with a computer of the system or apparatus, and then executing the program codes. In this case, so long as the system or apparatus has the functions of the program, the mode of implementation need not rely upon a program.

Accordingly, since the functions of the present invention are implemented by computer, the program codes per se installed in the computer also implement the present invention. In other words, the claims of the present invention also cover a computer program that is for the purpose of implementing the functions of the present invention.

In this case, so long as the system or apparatus has the functions of the program, the form of the program, e.g., object code, a program executed by an interpreter or script data supplied to an operating system, etc., does not matter.

Examples of storage media that can be used for supplying the program are a floppy disk, a hard disk, an optical disk, a magneto-optical disk, an MO, a CD-ROM, a CD-R, a CD-RW, a magnetic tape, a non-volatile memory a card, a ROM, a DVD (DVD-ROM, DVD-R), etc.

As for the method of supplying the program, the client computer can be connected to a website on the Internet using a browser possessed by the client computer, and the computer program per se of the present invention or an automatically installable compressed file of the program can be downloaded to a recording medium such as a hard disk. Further, the program of the present invention can be supplied by dividing the program code constituting the program into a plurality of files and downloading the files from different websites. In other words, a server on a network that downloads, to multiple users, the program files that implement the functions of the present invention by computer also is covered by the claims of the present invention.

Further, it is also possible to store the program of the present invention on a storage medium such as a CD-ROM upon encrypting the program, to distribute the storage medium to users, to allow users who meet certain requirements to download decryption key information from a website via the Internet, and to allow these users to run the encrypted program by using the key information, whereby the program is installed in the user computer.

Furthermore, besides the case where the aforesaid functions according to the embodiment are implemented by executing the read program by computer, an operating system or the like running on the computer may perform all or a part of the actual processing so that the functions of the foregoing embodiment can be implemented by this processing.

Furthermore, after the program read from the storage medium is written to a function expansion board inserted into the computer or to a memory provided in a function expansion unit connected to the computer, a CPU or the like mounted on the function expansion board or function expansion unit performs all or a part of the actual processing so that the functions of the foregoing embodiments can be implemented by this processing.

In accordance with the exposure apparatus and method of controlling the same according to the present invention, it is possible to raise the throughput without sacrificing alignment accuracy when a reticle pattern is aligned with respect to each of a plurality of shot areas on a substrate.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing each of an array of regions on a substrate to a pattern, said apparatus comprising:

an optical system configured to form an image of a mark and to obtain an image signal corresponding to the image; and an arithmetic unit configured to calculate a first parameter of conversion from a designed position of the array of regions on a first substrate to a corrected position thereof based on the image signals obtained by said optical system with respect to a mark in each of a subset of the array of regions, to calculate a second parameter of conversion from a designed position in one of the array of regions to a corrected position thereof based on the image signals obtained by said optical system with respect to a plurality of marks in one of the array of regions, to calculate a third parameter based on the calculated first and second parameters, the third parameter being a parameter of a function, which is a function of the first parameter and represents the second parameter, to calculate the first parameter with respect to a second substrate different from the first substrate based on the image signals obtained by said optical system with respect to a mark in each of a subset of the array of regions on the second substrate, and to calculate the second parameter with respect to the second substrate based on the first parameter calculated with respect to the second substrate and the third parameter calculated with respect to the first substrate.

2. An apparatus according to claim 1, wherein said arithmetic unit is configured to calculate as the third parameter at least one of a difference between the first and second parameters, a ratio between the first and second parameters, and a relational expression between the first and second parameters.

3. An apparatus according to claim 1, further comprising a controller configured to control said optical system and said arithmetic unit so as to obtain the first to third parameters with respect to at least the first substrate in a substrate lot.

4. An apparatus according to claim 1, wherein the first parameter relates to one of a translational shift amount of the array of regions, a rotational amount of the array of regions, and a magnification of the array of regions.

5. An apparatus according to claim 1, wherein the second parameter relates to one of a rotational amount of the one of the array of regions, a magnification of the one of the array of regions, and a distortion of the one of the array of regions.

6. A method of manufacturing a device, said method comprising steps of:
    exposing a substrate to a pattern using an exposure apparatus as defined in claim 1;
    developing the exposed substrate; and
    processing the developed substrate to manufacture the device.

7. An exposure method of exposing each of an array of regions on a substrate to a pattern, said method comprising steps of:
    a first operation of forming an image of a mark and obtaining an image signal corresponding to the image with respect to a mark in each of a subset of the array of regions on a substrate and a plurality of marks in one of the array of regions on the first substrate using an optical system;
    a first calculation of calculating a first parameter of conversion from a designed position of the array of regions on the first substrate to a corrected position thereof based on the image signals obtained by the optical system with respect to the mark in each of the subsets;
    a second calculation of calculating a second parameter of conversion from a designed position in the one of the array of regions on the first substrate to a corrected position thereof based on the image signals obtained by the optical system with respect to the plurality of marks in the one of the array of regions;
    a third calculation of calculating a third parameter based on the calculated first and second parameters, the third parameter being a parameter of a function, which is a function of the first parameter and represents the second parameter; and
    a second operation of forming an image of a mark and obtaining an image signal corresponding to the image with respect to a mark in each of a subset of the array of regions on a second substrate different from the first substrate using the optical system;
    a fourth calculation of calculating the first parameter with respect to the second substrate based on the image signals obtained by the optical system with respect to the mark in each of the subsets on the second substrate;
    a fifth calculation of calculating the second parameter with respect to the second substrate based on the first parameter calculated with respect to the second substrate and the third parameter calculated with respect to the first substrate;
    a first alignment of aligning the pattern to each of the array of regions on a first substrate based on the first parameter calculated in said first calculation step and the second parameter calculated in said second calculation step to expose each of the array of regions on the first substrate to the pattern aligned in said first alignment step; and
    a second alignment of aligning the pattern to each of the array of regions on the second substrate based on the first parameter calculated in said fourth calculation step and the second parameter calculated in said fifth calculation step to expose each of the array of regions on the second substrate to the pattern aligned in said second alignment step.

8. A method according to claim 7, wherein said third calculation step calculates as the third parameter at least one of a difference between the first and second parameters, a ratio between the first and second parameters, and a relational expression between the first and second parameters.

9. A method according to claim 7, wherein said first operation step and said first to third calculation steps are executed so as to obtain the first to third parameters with respect to at least the first substrate in a substrate lot.

10. A method according to claim 7, wherein the first parameter relates to one of a translational shift amount of the array of regions, a rotational amount of the array of regions, and a magnification of the array of regions.

11. A method according to claim 7, wherein the second parameter relates to one of a rotational amount of the one of the array of regions, a magnification of the one of the array of regions, and a distortion of the one of the array of regions.

* * * * *

UNITED STATES PATENT AND TRADEMARK OFFICE
CERTIFICATE OF CORRECTION

PATENT NO. : 7,224,459 B2
APPLICATION NO. : 10/234378
DATED : May 29, 2007
INVENTOR(S) : Osamu Morimoto Page 1 of 1

It is certified that error appears in the above-identified patent and that said Letters Patent is hereby corrected as shown below:

COLUMN 2:
Line 16, "system" should read -- system, --.
Line 18, "the" should read -- that --.

COLUMN 3:
Line 45, "1×1" should read -- 1×1 --.

COLUMN 4:
Line 33, "fth-degree" should read -- nth-degree --.

COLUMN 9:
Line 56, "lot be" should be -- lot to be --.

COLUMN 11:
Line 54, "step 607" should read -- step S607 --.

COLUMN 13:
Line 60, "memory a" should read -- memory --.

Signed and Sealed this

Eighteenth Day of December, 2007

JON W. DUDAS
*Director of the United States Patent and Trademark Office*